United States Patent [19]
Ayaki

[11] 3,710,272
[45] Jan. 9, 1973

[54] MULTI-STAGE TYPE MICROWAVE AMPLIFIER

[75] Inventor: Kazuo Ayaki, Tokyo-to, Japan

[73] Assignee: Nippon Electric Co., Ltd., Tokyo, Japan

[22] Filed: Oct. 4, 1971

[21] Appl. No.: 186,146

Related U.S. Application Data

[62] Division of Ser. No. 790,989, Jan. 14, 1969, Pat. No. 3,631,358.

[30] Foreign Application Priority Data

| | | |
|---|---|---|
| Jan. 17, 1968 | Japan | 43/2513 |
| Jan. 17, 1968 | Japan | 43/2514 |
| May 7, 1968 | Japan | 43/31415 |
| May 7, 1968 | Japan | 43/31416 |
| May 7, 1968 | Japan | 43/31417 |

[52] U.S. Cl. ....................330/53, 330/34, 330/157

[51] Int. Cl. ....................H03k 3/60

[58] Field of Search ....................330/53, 34

*Primary Examiner*—Nathan Kaufman
*Attorney*—Ostrolenk, Faber, Gerb and Soffen

[57] ABSTRACT

A microwave amplifier comprising a plurality of amplifier units connected in cascade fashion. Each of the amplifier units have substantially similar gain versus frequency characteristics, which characteristics are substantially flat over the entire operating frequency range. The units are connected by lines which in the microwave amplifier embodiment may be strip lines having electrical lengths which are selected in accordance with any one of a group of predetermined equations so as to provide a multi-stage microwave amplifier whose resultant gain versus-frequency characteristic is likewise substantially flat over the entire operating frequency range.

5 Claims, 9 Drawing Figures

INVENTOR
KAZUO AYAKI

BY

Ostrolenk, Faber, Gerb & Soffen
ATTORNEYS

INVENTOR.
KAZUO AYAKI

BY

Ostrolenk, Faber, Gerb & Soffen
ATTORNEYS

MULTI-STAGE TYPE MICROWAVE AMPLIFIER

This application is a Division of Serial No. 790,989 filed Jan. 14, 1969.

The present invention relates to a multi-stage type microwave amplifier. When wide-band microwave amplifiers, for example, microwave transistor amplifiers are connected in cascade to obtain a high gain, it is generally understood that the overall characteristic of gain versus frequency does not remain flat even though amplifiers having a flat characteristic of gain versus frequency are connected together. This occurs because the reflecting waves produced as a result mismatching of input impedance and output impedance of each of the unit amplifiers interfere with signal waves. To be brief, considering the case where amplifiers having flat gain versus frequency characteristics are connected to form a two-stage cascaded amplifier in order to keep the degree of flatness of the overall frequency characteristic below ±0.2 dB, both the output side VSWR in the first stage and the input side VSWR in the latter stage should be of the order of 1.35 or below. When the operative frequency band is narrow, it is easy to obtain a VSWR below 1.35, but it is usually difficult when an operating band width of more than 20 percent, for example, is needed. In the future, I.C. (integrated circuit) technology will be more frequently applied to microwave multi-stage amplifier circuits. In such cases it is most desirable to provide a circuit design that makes it possible to obtain desired high gain by connecting unit amplifiers of the same design in cascade. However, in order to connect unit amplifiers, whose input and output VSWR are not sufficiently low, in multi-stage fashion, the effect of reflected waves must be eliminated by inserting uniguides between each of the unit amplifiers. However, when a large number of uniguides are employed, the assembled device becomes large in the size and weight, and becomes expensive.

To solve this problem, a method has been disclosed in PROCEEDINGS OF THE IEEE, Mar., 1963, on pages 237–247, to eliminate the reflected waves by balancing two amplifiers having the characteristics substantially equal using a hybrid circuit. However, this method has the disadvantages of being expensive and requiring twice the normal electric power consumed, in comparison with normal techniques (i.e. unbalanced type) for obtaining equal gain, because twice the number of amplifier elements are needed. Furthermore, since two hybrid circuits are required for each stage, the circuit becomes complicated, making the fabrication thereof difficult.

The object of the present invention is to eliminate the above-stated disadvantages of the prior art and to provide a multi-stage amplifier which is simple in construction and easy to manufacture. The features and objects of this invention and the manner of attaining them will become more apparent and the invention itself will best be understood by reference to the following description of embodiments of the invention taken in conjunction with the accompanying drawings, the description of which follows.

Figure 1:
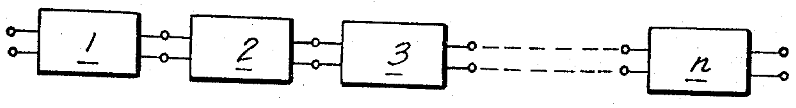
FIG. 1 shows a block diagram of a conventional multi-stage microwave amplifier in which amplifier units are connected in cascade.

The principle of the present invention will now be explained with reference to FIGS. 1 and 2. As shown in FIG. 1, unit amplifiers are connected in cascade. Representing the scattering matrix of each of the unit amplifiers (hereinafter referred to as the S matrix) by $S_{11}(n)$, $S_{22}(n)$, $S_{12}(n)$, $S_{21}(n)$, the overall gain is expressed by the following equation:

$$G=\frac{S_{21}(1)S_{21}(2)\;.\;.\;.\;.\;.\;S_{21}(n)}{\Delta n} \quad (1)$$

$$\Delta n \cong 1-S_{22}(1)\,S_{11}(2)-S_{22}(2)\,S_{11}(3)-\ldots-S_{22}(n-1)\,S_{11}(n) \quad (2)$$

In equation (2), terms above 4th power of $S_{ij}(n)$ are neglected because they are so small. Even if the gain-to-frequency characteristic of each of unit amplifiers may be flat, ripples are produced in the frequency characteristic of overall gain G, because the absolute value and the phase of each term after the second term in the right side of the equation (2) may change with the frequency, so far as $S_{11}(n)$, $S_{22}(n)$ are finite.

In this invention, lines having electrical lengths of $\theta_1$, $\theta_2$, . . . $\theta_{n-1}$, respectively, are inserted between each of the unit amplifiers, as shown in FIG. 2.

For the amplifier shown in FIG. 2, equations (1) and (2) are expressed as follows:

$$G=\frac{S_{21}(1)S_{21}(2)\;.\;.S_{21}(n)e^{-j}(\theta_1+\theta_2+\ldots+\theta n-1)}{\Delta n} \quad (3)$$

$$\Delta n \cong 1-S_{22}(1)\,S_{11}(2)\;e^{-j2\theta_1}-S_{22}(2)\,S_{11}(3)\;e^{-j2\theta_2}-\ldots-S_{22}(n-1)\,S_{11}(n)e^{-j2\theta}n-1 \quad (4)$$

Assuming that the characteristics of each of unit amplifiers are equal, equation (4) may be transformed as follows:

$$\Delta n \cong 1-S_{22}S_{11}(e^{-j2\theta_1}+e^{-j2\theta_2}\ldots\ldots+e^{-j2\theta}n-1) \quad (5)$$

In this equation (5) the terms above 4th power of $Sij$ are neglected, because they are so small. Now, when the conditions of the following equation (6) are satisfied at a frequency near the center of the band, $$e^{-j2\theta_1}+e^{-j2\theta_2}+e^{-j2\theta_3}+\ldots\ldots+e^{-j2\theta}n-1=0 \quad (6)$$

then, the term of $S_{22}\,S_{11}$ is eliminated and the value of $\Delta n$ in the equation (5) is as follows;

$$\Delta n \cong 1$$

Thus, the effect of reflecting waves at the input and output sides of each of the unit amplifiers upon the overall characteristic is greatly reduced, and a flat overall gain is obtained. Therefore, if values of $\theta_1$, $\theta_2$, . . . $\theta_{n-1}$ may be taken as satisfying the condition of the equation (6), a resultant characteristic having no ripple may be obtained.

Some embodiments wherein values of $\theta_1, \theta_2, \ldots \theta_{n-1}$ are given variously are explained in following descriptions.

EMBODIMENT I

Figure 2:
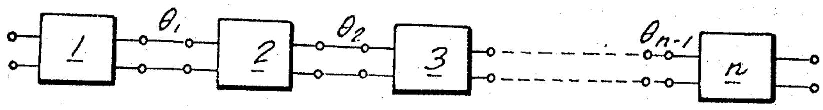
FIG. 2 shows a block diagram of a multi-stage microwave amplifier utilizing strip lines and which illustrates the principle of the present invention.

In this embodiment, lines having electrical lengths of $\theta_1, \theta_2, \ldots \theta_{n-1}$ are inserted between each of unit amplifier as shown in FIG. 2, and they are given by the following equations at the frequency near the center of the operating band:

$$\theta_1 = \theta_0,\ \theta_2 = \theta_0 + (\pi/n-1),\ \theta_3 = \theta_0 + 2(\pi/n-1),,,\ \theta_{n-1} = \theta_0 + (n-2)(\pi/n-1)$$

Or, when wavelength of the lines employed is $\lambda g$, the lengths of each line are given as follows:

$$l_1 = l_0,\ l_2 = l_0 + \frac{1}{2(n-1)}\lambda g,\ l_3 = l_0 + \frac{2}{2(n-1)}\lambda g, \ldots\ldots\ldots\ l_{n-1} = l_0 + \frac{n-2}{2(n-1)}\lambda g.$$

In this case $\theta_o$ and $l_o$ are arbitrary and may be zero. Assuming that characteristics of each of amplifier are equal, $\Delta n$ in the equation (5) becomes as follows $$\Delta n \simeq 1 - S_{11}S_{22}(e^{-j2\theta_1} + e^{-j2\theta_2} + \ldots + e^{-j2\theta}n - 1)$$

$$= 1 - S_{11}S_{22}e^{-j2\theta_0}\left(1 + e^{-j}\frac{2\pi}{n-1} + e^{-j2}\cdot\frac{2\pi}{n-1}\ldots\ldots + e^{-j(n-2)}\frac{2\pi}{n-1}\right) = 1$$

Figure 5:
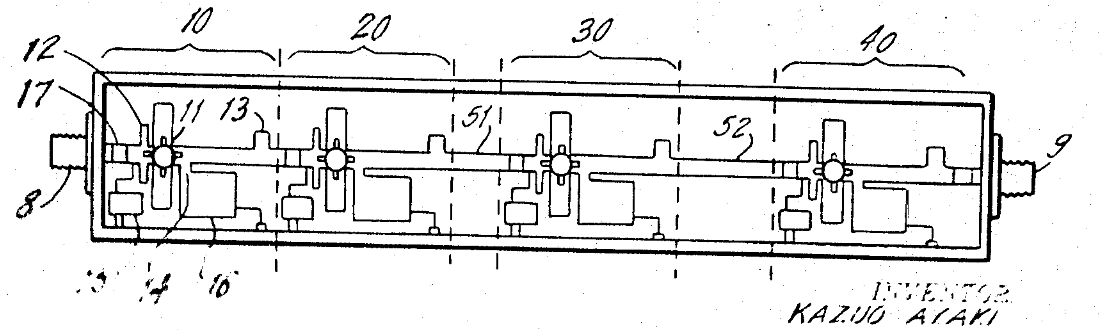
FIGS. 5–9 are plan views showing microwave transistor amplifiers in their physical form arranged as multi-stage type transistor amplifiers and including strip lines for obtaining flat gain over the frequency bandwidth of interest.

Namely, the equation (6) is satisfied, and as the term of $S_{11}S_{22}$ whose absolute value is largest in terms in $\Delta n$ is eliminated, $\Delta n$ approaches unity and hence the ripples of the overall characteristic of gain VS. frequency becomes extremely small. Then the order of the insertion of $l_1, l_2, l_3, \ldots l_{n-1}$ between each of amplifier is arbitrary. In FIG. 5 there is shown an embodiment where the principle of this embodiment is applied to a four-stage type microwave transistor amplifier. A signal is applied to a connector 8 and appears at a connector 9 after amplification. 10 shows the first stage unit amplifier which has flat characteristic of gain VS. frequency. 11 is a transistor having a grounded emitter. The base and collector terminals are connected to the strip lines each having a characteristic impedance of 50 ohms. 12 and 13 are capacitive susceptances, respectively, provided at the input and output circuits, and 14 is an inductive susceptance which is provided at the output side. 15 and 16 are high frequency short circuit capacitors, and 17 is a D.C. blocking capacitor. 20, 30 and 40 are unit amplifiers having characteristics which are substantially equal to that of amplifier 10, and 51 and 52 are lines inserted between amplifiers 20–30 and 30–40 whose lengths are respectively one-sixth of the wavelength and one-third of the wavelength (at the center frequency). In this embodiment $\theta_o$ (or $l_o$) has been selected zero. Each unit amplifier utilized has a flat characteristic of gain VS. frequency. The ripples of gain produced by connecting amplifiers 10–40 is reduced by the inserted lines 51, 52 so that the flat overall frequency characteristic can be obtained.

EMBODIMENT II

Figure 3:
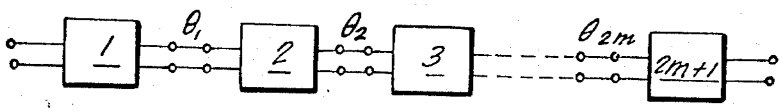
FIG. 3 shows a block diagram view, similar to FIG. 2 for illustrating the principle of the invention when applied to a $(2m+1)$-stage microwave amplifier.

In this embodiment, $n$ equals to $(2m+1)$, and lines having electrical lengths of $\theta_1, \theta_2, \ldots \theta_m, \theta_{m+1}, \ldots \theta_{2m}$ are inserted between each of unit amplifier as shown in FIG. 3, and the following equations are satisfied among them at the frequency near the center of the band.

$$\left.\begin{aligned}\theta_{m+1} &= \theta_1 + (\pi/2)(2m_1-1)\\ \theta_{m+2} &= \theta_2 + (\pi/2)(2m_2-1)\\ \theta_{2m} &= \theta_m + (\pi/2)(2m_m c l\ 1)\end{aligned}\right\} \quad (7)$$

Alternatively in terms of wavelength values for the lines $\lambda g$, the lengths of each line are given as follows:

$$\begin{aligned}l_{m+1} &= l_1 + (\lambda g/4)(2m-1)\\ l_{m+2} &= l_2 + (\lambda g/4)(2m_2-1)\\ l_{2m} &= lm + (\lambda g/4)(2m_m-1)\end{aligned}$$

In this case $m_1, m_2, \ldots m_m$ are integers of 1 or more and it is desirable that they be equal to 1 in order to provide a favorable frequency characteristic. However, each of the values of $\theta_1, \theta_2, \ldots \theta_m$ or $l_1, l_2, \ldots l_m$ may be arbitrary and may be selected to be zero. Provided that the characteristics of each of amplifiers are equal to $\Delta n$ of the equation (4) becomes as follows:

$$\Delta_{2m+1} = 1 - S_{11}S_{22}(e^{-j2\theta_1} + e^{-j2\theta_2} + \ldots\ldots + e^{-j2\theta}2m) \quad (8)$$

Substituting the equations (7) for the equation (8), the value of $\Delta_{2m+1}$ becomes 1. Namely the equations (7) satisfy the equation (6), and as the term of $S_{11}S_{22}$ whose absolute value is largest in terms in $\Delta_{2m+1}$ is eliminated, $\Delta_{2m+1}$ approaches the value of unity and, therefore, ripple of the overall characteristic of gain VS. frequency is reduced extremely. Moreover, there remains the freedom that it is possible to select the values of $\theta_1, \theta_2, \ldots \theta_m$ arbitrarily, so that by selecting these values properly it is also possible to make the change of $|\Delta_{2m+1}|$ due to frequency, minimum over the bandwidth. Whereas the order of inserting each line between amplifiers may be arbitrary, it is desirable to arrange $l_1$ and $l_{m+1}$, $l_2$ and $l_{m+2}$, ... and $lm$ and $l_2m$ in succession respectively.

Figure 6:
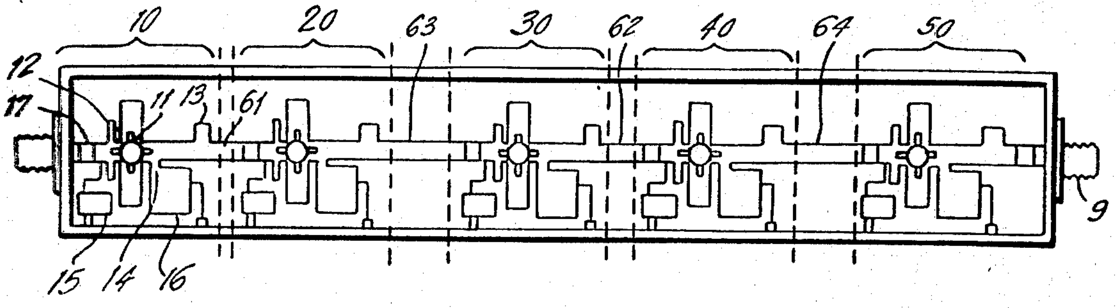

In Fig. 6 there is shown an embodiment where the principle of this embodiment is applied to a five-stage-type microwave transistor amplifier. 10 is a first stage unit amplifier having a flat characteristic of gain VS. frequency. 11 is a transistor with its emitter grounded and its base and its collector terminals connected to strip lines each having a characteristic impedance of 50 ohms. 12 and 13 are capacitive susceptances which are respectively provided at the input and output circuits, and 14 is an inductive susceptance which is provided at the output side. 15 and 16 are high frequency short circuit capacitors, and 17 is a D.C. blocking capacitor. 20, 30, 40 and 50 are unit amplifiers having characteristics which are substantially equal to that of 10. 61 and 62 are lines which are inserted respectively between the first and second stages and between the third and fourth stages and these lengths are $l_1$ and $l_2$ are selected arbitrarily. 63 and 64 are lines which are inserted respectively between the second and third stages and between the fourth and fifth stages and these lengths are $1 + (\lambda g/4)$ and $l_2 + (\lambda g/4)$. In this case $\lambda g$ denotes the wavelength on lines at the frequency near the center of the band. A signal is applied to a connector 8 and appears at a connector 9 after amplification. In this cascaded amplifier, the ripple of the gain characteristic produced by connecting unit amplifiers of flat characteristic of gain VS. frequency is reduced by the inserted lines 61, 62, 63 and 64, so that the flat overall frequency characteristic can be obtained.

EMBODIMENT III

In this embodiment, $n$ is chosen as being equal to $(2m+1)$, and lines having electrical lengths of $e_1, e_2, \ldots \theta_{2m}$, respectively, are inserted between each of the unit amplifiers, as shown in FIG. 3 and $\theta_1, \theta_2, \ldots \theta_{2m}$ are given as meeting the equations:

$$\left.\begin{array}{l} \theta_1=\theta_o+\theta'_1,\ \theta_2=\theta_o+\theta'_2 \ldots \theta_m=\theta_o+\theta'_m \\ e_{m+1}=\theta_o+\pi-\theta'_1,\ \theta_{m+2}=\theta_o+\pi-\theta'_2 \ldots \\ \theta_{2m}=\theta_o+\pi-\theta'_m \end{array}\right\} \quad (9)$$

and $\theta'_1, \theta'_2 \ldots \theta_m{}'$ are assumed to satisfy the following equation at a frequency near the center of the amplifying band ($\theta_o$ is an optional number):

$$\cos 2\theta'_1+\cos 2\theta'_2+\ldots+\cos 2\theta'_m=0 \quad (10)$$

As the characteristics of each of unit amplifiers are equal, the equation (4) may be transformed as follows:

$$\Delta 2m+1 \cong 1-S_{11}S_{22}(e^{-j2\theta_1}+e^{-j2\theta_2}+\ldots + e^{-j2\theta 2m}) \quad (11)$$

By substituting the equation (9) for the equation (11), we have $\Delta 2m+1$ as follows:

$$\Delta 2m+1 \cong 1-S_{11}/S_{22}\, e^{-j2\theta_o} \times 2(\cos 2\theta'_1+\cos 2\theta'_2+\ldots+\cos 2\theta'_m)$$

Therefore, as the conditions of the equation (10) are satisfied at a frequency near the center of the band, $$\Delta 2m+1 \cong 1$$

near that frequency. That is, the equation (6) is satisfied and effect of reflecting waves at the input and output sides of each of the unit amplifiers upon the overall gain versus frequency characteristic is greatly reduced, and a flat overall gain is obtained.

Considering now a seven-stage type amplifier as an example of this embodiment. In this case the equation (10) may be expressed as follows:

$$\cos 2\theta'_1+\cos 2\theta'_2+\cos 2\theta'_3=0 \quad (12)$$

$\theta_1', \theta_2', \theta_2'$, which satisfy the equation (12) take the following values:

$$\begin{array}{l} 2\theta'_1=\pi/12 \\ 2\theta'_2=\cos^{-1}(1-\cos\pi/12) \approx 1.536 \\ 2\theta'_3=\pi \end{array} \quad (13)$$

The values of $\theta_1, \theta_2 \ldots \theta_{2m}$ are given from the equations (13) and (9) as follows:

$$\left.\begin{array}{l} \theta_1=\pi/24 \\ \theta_2=\tfrac{1}{2}\cos^{-1}(1-\cos\pi/12) \approx 0.768 \\ \theta_3=\pi/2 \\ \theta_4=(23/24)\pi \\ \theta_5=\pi-\tfrac{1}{2}\cos^{-1}(1-\cos\pi/12) \approx 2.373 \\ \theta_6=\pi/2 \end{array}\right\} \quad (14)$$

In this case, $\theta_o$ is selected as zero.

When the wavelength of the lines is $\lambda g$, lengths of each line are given as follows:

$$l_1=(1/48)\lambda g,\ l_2=(0.768/2\pi)\lambda g,\ l_3=\lambda g/4,$$

$$l_4=(23/48)\lambda g,\ l_5=(2.373/2\pi)\lambda g,\ l_6=\lambda g/4 \quad (15)$$

Figure 7:
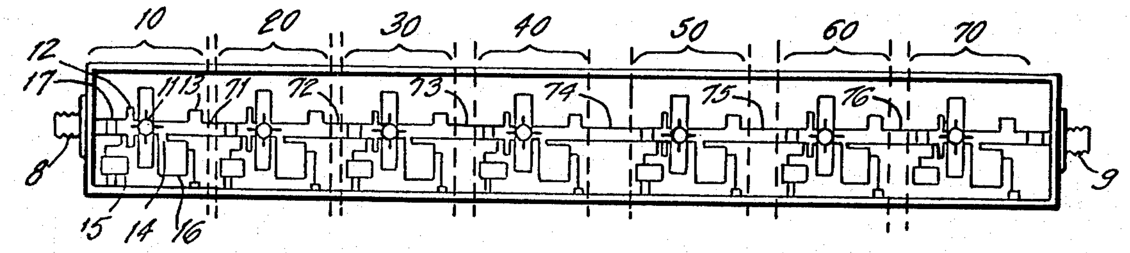

In FIG. 7 there is shown an embodiment where the present invention is employed in a seven-stage-type microwave transistor amplifier. The numeral 10 shows the first-stage unit amplifier, which has a flat gain vs. frequency characteristic. 11 is a transistor having a grounded emitter and base and collector terminals connected to strip lines each having a characteristic impedance of 50 ohms. 12 and 13 are capacitances provided in the input and output circuits, respectively, 14 is an inductive susceptance placed in the output side. 15 and 16 are high-frequency short circuit capacitors, 17 is a D.C. blocking capacitor. 20, 30, 40, 50,60 and 70 are unit amplifiers having characteristics which are substantially equal to that of 10. Between each of the unit amplifiers, lines 71, 72, 73, 74, 75 and 76 each having lengths of $l_1, l_2, l_3, l_4, l_5, l_6$ are inserted respectively. The values of $l_1, l_2, \ldots l_6$ are given by the equation (15). The signal is applied to connector 8, and is taken out of the connector 9 after being amplified. In this amplifier, since the ripples of the frequency characteristic produced by connecting the unit amplifier having flat gain-frequency characteristic are reduced by the reason of the structure mentioned above, a flat overall gain VS. frequency characteristic is obtained

EMBODIMENT IV

Figure 4:
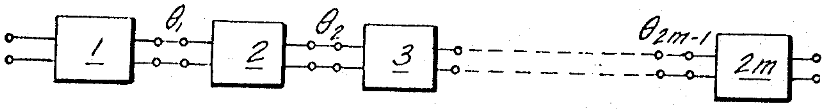
FIG. 4 shows a block diagram view similar to FIGS. 2 and 3 for illustrating the principle of the invention when applied to a $2m$-stage microwave amplifier.

In this embodiment, $n$ equals to $2m$ and lines having electrical lengths of $\theta_1, \theta_2, \ldots \theta_{2m-1}$, respectively, are inserted between each of the unit amplifiers, as shown in FIG. 4. Now, $\theta_1, \theta_2 \ldots \theta_{2m-1}$ are assumed to be those given by the equations:

$$\left.\begin{array}{l} \theta_1=\theta_o'\ \theta_2=\theta_o+\theta_2',\ \theta_3=\theta_o+\theta_3' \ldots \theta_m=\theta_o+\theta_m' \\ \theta_{m+1}=\theta_o+\pi-\theta_2',\ \theta_{m+2}=\theta_o+\pi-\theta_3' \ldots \\ \theta_{2m-1}=\theta_o+\pi-\theta_m' \end{array}\right\} \quad (16)$$

and $\theta_2', \theta_3' \ldots \theta_m'$ are assumed to satisfy the amplifying equation at a frequency near the center of the amplifying band ($\theta_o$ is an optional value or equal to zero):

$$\cos 2\theta_2'+\cos 2\theta_3'+\ldots+\cos 2\theta_m'=-\tfrac{1}{2} \quad (17)$$

As the characteristics of each of unit amplifiers are equal, the equation (4) may be transformed as follows:

$$\Delta 2m \cong 1-S_{11}S_{22}(e^{-j2\theta_1}+e^{-j2\theta_2}+\ldots + e^{-j2\theta 2m-1}) \quad (18)$$

By substituting the equation (16) for the equation (18), $\Delta 2m$ is given as follows:

$$\Delta 2m \cong 1-S_{11}S_{22}\, e^{-j2\theta_o} \times 2(\tfrac{1}{2}+\cos 2\theta_2'+\cos\theta_3' \ldots + \cos 2\theta_m') \quad (19)$$

Therefore, as the conditions of the equation (17) are satisfied at a frequency near the center of the band, $$\Delta 2m \cong 1$$

near that frequency. That is, the equation (6) is satisfied, the effect of reflecting waves at the input and output sides of each of the unit amplifiers upon the overall characteristics is greatly reduced, and a favorable overall gain VS. frequency characteristic is obtained.

Considering now a six-stage type amplifier as an example of this embodiment. In this case the equation (17) may be expressed as follows:

$$\cos 2\theta_2' + \cos 2\theta_3' = -\tfrac{1}{2} \quad (20)$$

$\theta_2'$, $\theta_3'$, which satisfy the equation (20), take the following values:

$$\theta_2' = \theta_3' = \tfrac{1}{2}\cos^{-1}(-\tfrac{1}{4}) \approx 0.912 \quad (21)$$

Values of $\theta_1, \theta_2, \ldots \theta_5$ are given from the equation (21) and (16) as follows:

$$\theta_1 = 0$$
$$\theta_2 = \theta_3 = \tfrac{1}{2}\cos^{-1}(-\tfrac{1}{4}) \approx 0.912$$
$$\theta_4 = \theta_5 = \pi - \tfrac{1}{2}\cos^{-1}(-\tfrac{1}{4}) \approx 2.229 \quad (22)$$

in this case, $\theta_o$ is selected as zero.

When the wavelength of the lines is $\lambda g$, the lengths of each line are given by the following equations:

$$\left.\begin{aligned} l_1 &= 0 \\ l_2 = l_3 &= (0.912/2\pi)\lambda g \\ l_4 = l_5 &= (2.229/2\lambda)\lambda g \end{aligned}\right\} \quad (23)$$

Figure 8:
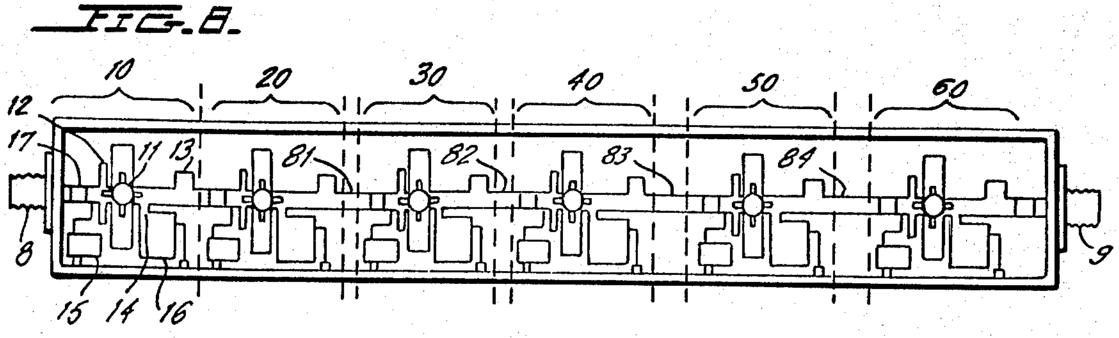

FIG. 8 shows a practical embodiment where this technique is applied to a six-stage-type microwave transistor amplifier. The numeral 10 shows the first-stage unit amplifier, which has a flat gain VS. frequency characteristic. 11 is a transistor, its emitter is grounded, its base and its collector terminals are connected to the strip line having 50 ohms. 12 and 13 are capacitative susceptances provided in the input and output circuits, respectively, 14 is an inductive suspectance placed in the output side. 15 and 16 are high frequency short circuit capacitors, 17 is a D.C. blocking capacitor. 20, 30, 40, 50 and 60 are unit amplifiers having characteristics which are substantially equal to that of 10. 10 and 20 are each connected directly ($l_1$=0), but between 20 and 30, 30 and 40, 40 and 50, 50 and 60, lines 81, 82 and 83, and 84 each having a length of $l_2$, $l_3$, $l_4$, $l_5$ are inserted, respectively. Values of $l_2$, $l_3$, $l_4$ and $l_5$ are given by the equation (23). The signal is applied on the connector 8 and is taken out of the connector 9 after being amplified. In this amplifier, since the ripple of the frequency characteristic produced by connecting the unit amplifier having a flat gain VS. frequency characteristic is reduced by the reason mentioned above, a flat overall frequency characteristic is obtained.

EMBODIMENT V

In this embodiment, lines having electrical length of $\theta_1, \theta_2, \ldots \theta_{n-1}$, respectively are inserted between each of the unit amplifiers, as shown in FIG. 2, and $\theta 1, \theta_2 \ldots \theta_{n-1}$ are those which satisfy the following equations at frequencies near the center of the amplifying band:

$$\left.\begin{aligned} & e^{-j2\theta_1} + e^{-j2\theta_2} + \ldots\ldots + e^{-j2\theta k} = 0 \\ & e^{-j2\theta k+1} + e^{-j2\theta k+2} + \ldots + e^{-j2\theta n-1} = 0 \\ & 2 \leqq K \leqq n-3 \end{aligned}\right\} \quad (24)$$

Therefore the equation (6) is satisfied, and the value of $\Delta n$ in the equation (5) is as follows:

$$\Delta n \cong 1$$

That is, effect of reflecting waves at the input and output sides of each of the unit amplifiers upon the overall characteristic is greatly reduced, and a flat overall gain is obtained.

Considering now a six-stage type amplifier as an example of this embodiment, in the equation (24), by putting $k$=2, the equation may be expressed as follows:

$$e^{-j2\theta_1} + e^{-j2\theta_2} = 0$$
$$e^{-j2\theta_3} = e^{-j2\theta_4} + e^{-j2\theta_5} = 0 \quad (25)$$

Inserting lines having lengths of $l_1$, $l_2$, $l_3$, $l_4$ and $l_5$ between each of the unit amplifiers, and giving the values thereof as follows:

$$l_1 = 0, l_2 = \lambda g/4,$$
$$l_3 = 0, l_4 = \lambda g/6, l_5 = \lambda g/3$$

Where $\lambda g$ shows a wave length on the line at the frequency near the center of the amplifying band. At the frequency, $\theta_1 \sim \theta_5$ may be expressed as follows:

$$2\theta_1 = 0, 2\theta_2 = \pi$$

$2\theta_3 = 0$, $2\theta_4 = \tfrac{2}{3}\pi$, $2\theta_5 = 4\pi/3$ Accordingly, it is evident that the conditions of the equation (25) are satisfied.

Figure 9:
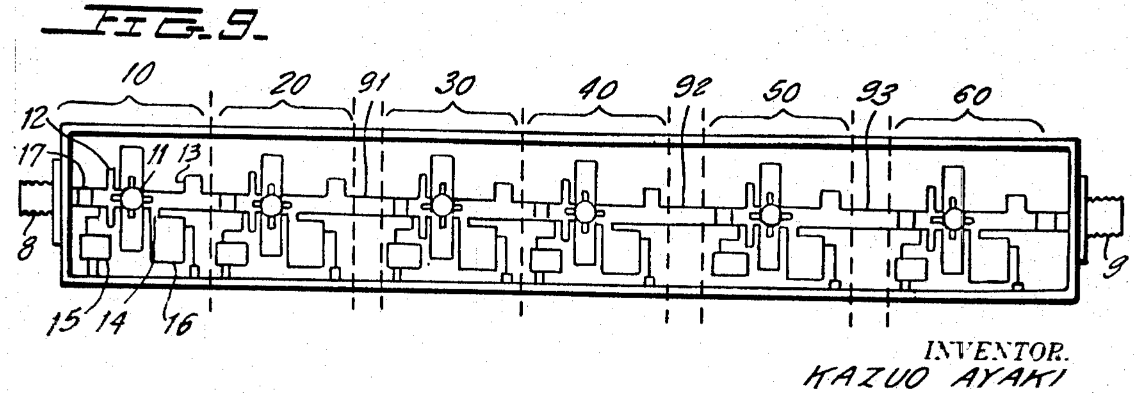

In FIG. 9, there is shown an embodiment where this embodiment is applied on a six-stage-type microwave transistor amplifier. The numeral 10 shows the first stage unit amplifier which has a flat gain-frequency characteristic. 11 is a transistor, its emitter is grounded, its base and its collector terminals are connected to the strip line having characteristic impedance of 50 ohms. 12 and 13 are capacitative susceptances provided in the input and output circuits, respectively. 14 is an inductive susceptance placed in the output side. 15 and 16 are high frequency short circuit capacitors. 17 is a D.C. blocking capacitor. 20, 30, 40/50 and 60 are unit amplifiers having characteristics which are substantially equal to that of 10. 10 and 20, 30 and 40 are each connected directly ($l_1 = 0$, $l_3 = 0$), but between 20 and 30, 40 and 50, 50 and 60, lines 91, 92 and 93 are inserted, respectively. The lengths thereof are $\lambda g/4$, $\lambda g/6$, and $\lambda g/3$, where $\lambda g$ represents the wave length on the line at the frequency near the center of the band. The signal is applied on the connector 8 and is taken out of the connector 9 after being amplified. In this amplifier, since the ripple on the gain produced by connecting the unit amplifier having a flat gain VS. frequency characteristic is reduced by the reason mentioned above, a flat overall frequency characteristic is obtained.

Embodiments have been shown in above descriptions where the present invention is applied on a microwave transistor amplifier, but it is to be understood the technique can also be applied other cascaded amplifier circuits that are to be cascaded.

Although there is shown a case, in the above description, where simple transmission lines are used for the lines to be inserted, it is also possible to use circuit comprising capacitances and/or inductances.

Furthermore, it is also possible first to assemble a unit amplifier composed of plural stages of amplifiers, and further to cascade the unit amplifiers according to the principle of the present invention.

WHAT IS CLAIMED IS:

1. A multi-stage type microwave amplifier formed by connecting ($2m$+1) unit amplifiers ($m$ being any integer equal to or greater than 1) having substantially equal gain versus frequency characteristics in cascade, in which a first group of $m$ lines having respectively arbitrary electrical lengths of $\theta_1, \theta_2, \ldots \theta_m$ are inserted one by one at $m$ locations between each of a selected group of said unit amplifiers, and a second group of lines having electrical lengths given by $\theta_1 + \pi/2\,(2m_1 - 1)$, $\theta_2 + \pi/2\,(2m_2 - 1)$, $\ldots\ \theta_m + \pi/2\,(2m_m - 1)$ ($m_1, m_2, \ldots m_m$ being integers equal to or greater than one) at a frequency near the center of the amplification band are inserted one by one between the remaining unit amplifiers.

2. A multiple-stage type microwave amplifier comprising $(2m+1)$ amplifier units each having substantially equal gain versus frequency characteristics, wherein $m$ is any integer equal to or greater than 1;

$2m$ lines each having an electrical length of $\theta_o+\theta_1'$, $\theta_o+\theta_2'$, . . . $\theta_o+\theta_m'$, $\theta_o+\pi-\theta_1'$, $\theta_o+\pi-\theta_2'$ . . . $\theta_o+\pi-\theta_m'$ ($\theta_o$ being equal to or greater than zero) and $\theta_1'$, $\theta_2'$ . . . $\theta_m'$ satisfying the condition $\cos 2\theta_1' + \cos 2\theta_2' + \ldots + \cos 2\theta_m' = 0$ at a frequency near the center of the amplifying band being inserted one by one between each of said $(2m+1)$ unit amplifiers.

3. A multiple-stage type microwave amplifier comprising $1m$ amplifier units each having substantially equal gain versus frequency characteristics, wherein $m$ is any integer equal to or greater than 1;

$(2m-1)$ lines each having electrical lengths of $\theta_o$, $\theta_o+\theta_2'$, $\theta_o+\theta_3'$, . . . $\theta_o+\theta_m'$, $\theta_o+\pi-\theta_2'$, $\theta_o+\pi-\theta_3'$ . . . . . $\theta_o+\pi-\theta_m'$ ($\theta_o$ being equal to or greater than zero) and $\theta_1'$, $\theta_2'$ . . . $\theta_m'$ satisfying the condition:

$\cos 2\theta_2 + \cos 2\theta_3' + \ldots\ldots + \cos 2\theta_m' = -\frac{1}{2}$ at a frequency near the center of the amplifying band, being inserted one by one between each of the $2m$ unit amplifiers.

4. A multiple-stage type microwave amplifier comprising $(n)$ amplifier units each having substantially equal gain versus frequency characteristics, wherein $n$ is any integer equal to or greater than 5;

$(n-1)$ lines each having electrical lengths of $\theta_1$, $\theta_2$ . . . $\theta_{n-1}$ (said lines having electrical lengths equal to or greater than zero) said lengths satisfying the conditions:

$$e^{-j2\theta_1}+e^{-j2\theta_2}+\ldots\ldots+e^{-j2\theta_k}=0$$

$$e^{-j2\theta_{k+1}}+e^{-j2\theta_{k+1}}+\ldots\ldots+e^{-j2\theta_{n-1}}=0$$

$2 \leqq k \leqq -3$ at a frequency near the center of the amplifying band, being inserted one by one between each of $n$ unit amplifiers ($n \geqq 5$) having substantially equal characteristics.

5. A multistage microwave amplifier having a substantially flat gain versus frequency response curve over a predetermined portion of the microwave frequency range comprising:

$n$ transistor amplifier stages each having substantially equal gain versus frequency operating characteristics where $n \geqslant 3$;

$n-1$ strip lines each being connected between the output of an amplifier stage and the input of the next amplifier stage, wherein the order of said strip lines relative to the amplifier stages may be arbitrarily selected;

each of said strip lines being of a different electrical length ($l$) wherein the electrical length $l_1$, $l_2$ . . . $l_{n-1}$ of each strip line is $l_1=l_o$; $l_2=l_o+1/[2(n-1)]\lambda g$; $l_3=l_o+2/[2(n-1)]\lambda g$; . . . $l_{n-1}=l_o+n-2/[2(n-1)]\lambda g$ where $\lambda g$ = the wavelength of the signal to be amplified and where $l_o \geqslant 0$.

* * * * *